United States Patent [19]
Cronin, III et al.

[11] Patent Number: 5,699,309
[45] Date of Patent: Dec. 16, 1997

[54] METHOD AND APPARATUS FOR PROVIDING USER SELECTABLE LOW POWER AND HIGH PERFORMANCE MEMORY ACCESS MODES

[75] Inventors: Daniel R. Cronin, III, Lake Worth; Ricardo Fernandez, Miami Beach, both of Fla.

[73] Assignee: Motorola, Inc., Schaumburg, Ill.

[21] Appl. No.: 645,377

[22] Filed: May 13, 1996

[51] Int. Cl.$^6$ ................................................. G11C 7/00
[52] U.S. Cl. ................... 365/203; 365/233.5; 365/226; 365/230.06
[58] Field of Search .................... 365/203, 233.5, 365/226, 229, 230.06

[56] References Cited

U.S. PATENT DOCUMENTS

5,305,268  4/1994  McClure ........................... 365/203

*Primary Examiner*—David C. Nelms
*Assistant Examiner*—Huan Hoang
*Attorney, Agent, or Firm*—James A. Lamb

[57] ABSTRACT

A data processing system (10) for providing memory access to a memory (18). The memory (18) includes a memory array (43) having a plurality of memory cells arranged in rows and columns and an address decoder (42) for accessing a memory cell (44) of the memory array (43) in response to decoding an address signal. Precharge logic (49) coupled to the memory array (43) and the address decoder (42) enables, in a high performance mode, all columns of the memory array (43) prior to accessing the memory cell (44). In a low power mode, the precharge logic (49) enables only selected columns of the memory array (43) prior to accessing the memory cell (44).

19 Claims, 6 Drawing Sheets

METHOD AND APPARATUS FOR PROVIDING USER SELECTABLE LOW POWER AND HIGH PERFORMANCE MEMORY ACCESS MODES

FIELD OF THE INVENTION

This invention relates in general to electronic devices having memories, and more specifically to electronic devices that access memories in different modes.

BACKGROUND OF THE INVENTION

Data processing systems, such as microcontrollers, commonly use onboard memory. There are various types of memory, e.g., both volatile and nonvolatile memory, used on-board a microcontroller. Many conventional memory types, such as static random access memory (SRAM) or read only memory (ROM), can operate at relatively high access speeds. However, high speed operation generally requires high power consumption, which is undesirable for applications such as battery powered computers or battery powered portable messaging devices, e.g., pagers. In such devices, low power consumption may, at times, be more important than high speed operations.

To reduce power consumption in prior art data processing systems having an on-board memory, the memory may be disabled when it is not being used. However, an access to the memory requires that it be re-enabled before access can occur. As a result, the data processing system must wait until the memory has been re-enabled before data can be written to or read from the memory. Also, lower power consumption has been achieved in a memory by operating the memory at a lower clock frequency. However, lowering the clock frequency at which the memory operates also affects the operation of the entire data processing system.

Thus, what is needed is an improved low power mode for use with a memory included in an electronic device.

DESCRIPTION OF A PREFERRED EMBODIMENT

Generally, the present invention provides a low power operating mode for a memory in a data processing system. This is accomplished by providing a programmable control bit for switching methods of memory precharging, i.e., enabling the memory prior to accessing it for a data transaction. During a high performance mode, a global precharge of the memory occurs during the same time in which an address of the memory is being decoded. During a low power mode, the memory address is decoded first, subsequent to which memory regions are selectively precharged. Specifically, only regions of the memory associated with the decoded address are precharged in the low power mode.

Hereinafter, the terms "assert" and "negate" will be used when referring to the rendering of a signal, status bit, or similar apparatus into its logically true or logically false state, respectively. If the logically true state is a digital logic level one, the logically false state will be a digital logic level zero. On the other hand, if the logically true state is a digital logic level zero, the logically false state will be a digital logic level one. The term "bus" will be used to refer to a plurality of signals which may be used to transfer one or more various types of information, such as data, addresses, control, or status information.

Figure 1:
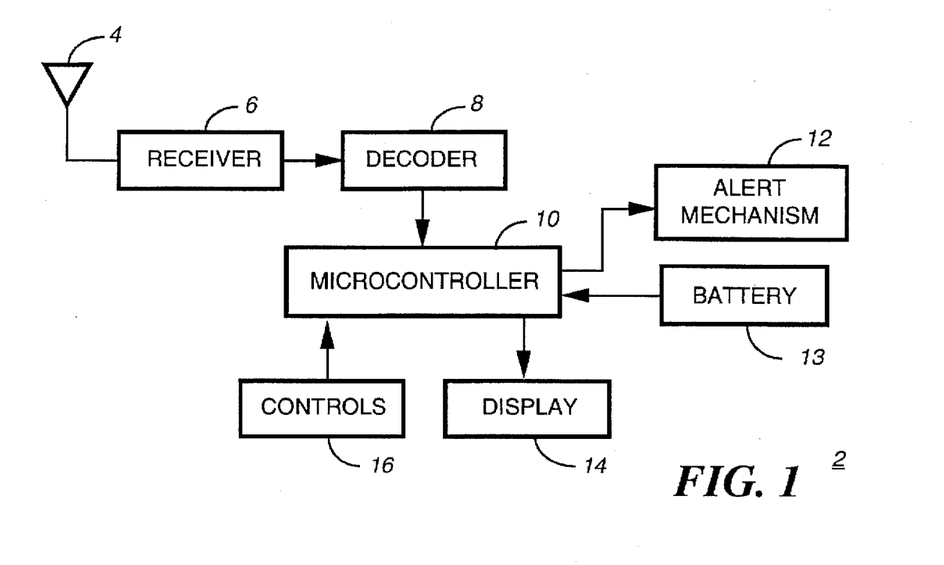
FIG. 1 is a block diagram of an electronic device, such as a portable messaging device, in accordance with the present invention.

FIG. 1 illustrates, in block diagram form, an electronic device 2 in which memory is utilized. The electronic device 2 can, for instance, comprise a portable messaging device, such as a paging receiver or paging transceiver. When the device 2 is a portable messaging device, it preferably includes an antenna 4 for receiving a radio signal, a receiver 6 for demodulating the radio signal, and a decoder 8 for decoding the demodulated signal. A data processing system 10, such as a microcontroller, further processes the decoded information and controls operation of the device 2. The device 2 can further include an alert mechanism 12 for generating an alert in response to message reception, a display 14 for presenting received messages, and controls 16 for receiving user-initiated signals. In portable applications, the electronic device 2 can also include a battery 13 for providing power.

Figure 2:
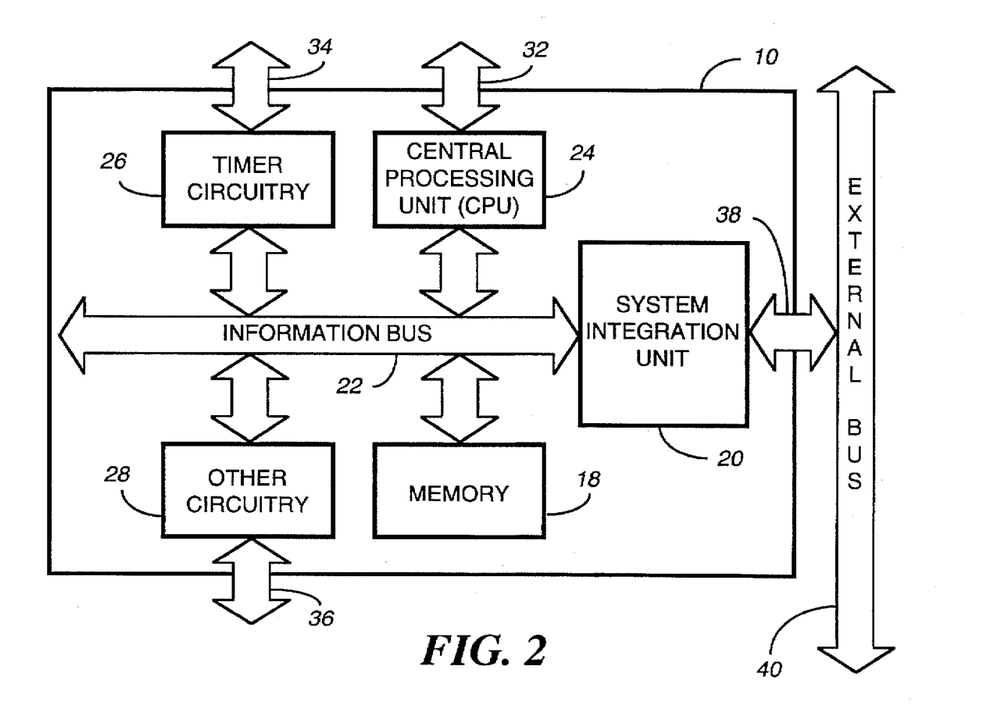
FIG. 2 is a block diagram of a data processing system, such as a microcontroller, included in the electronic device of FIG. 1 in accordance with the present invention.

FIG. 2 is a block diagram of the data processing system 10, which can be implemented as a single integrated circuit, e.g., a microcontroller, as mentioned above. Data processing system 10 has various on-board peripherals which are bi-directionally coupled by way of an information bus 22. The particular embodiment of data processing system 10 illustrated in FIG. 2 has a central processing unit (CPU) 24, timer circuitry 26, memory 18, other circuitry 28, and system integration unit 20, all of which are preferably bi-directionally coupled to information bus 22. Other circuitry 28 could include, for instance, other memory devices, an analog-to-digital converter, or serial circuitry.

System integration unit 20 can receive and transmit signals external to data processing system 10 by way of integrated circuit pins 38. Integrated circuit pins 38 may optionally be coupled to an external bus 40. CPU 24 can optionally receive and transmit signals external to data processing system 10 by way of integrated circuit pins 32. Timer circuitry 26 can receive and transmit signals external to data processing system 10 by way of integrated circuit pins 34, while integrated circuit pins 36 provide external access to circuitry 28.

The embodiment of data processing system 10 which is shown in FIG. 2 illustrates one particular microcontroller within a family of microcontrollers. Because microcontrollers in the same family generally have a plurality of differing on-board peripherals, FIG. 2 shows only one embodiment of data processing system 10. Alternate embodiments of data processing system 10 can have fewer, more, or different on-board peripherals. Memory 18, which could be a read only memory (ROM) or other semiconductor memory, could be located externally to data processing system 10, rather than implemented as an on-board peripheral.

Figure 3:
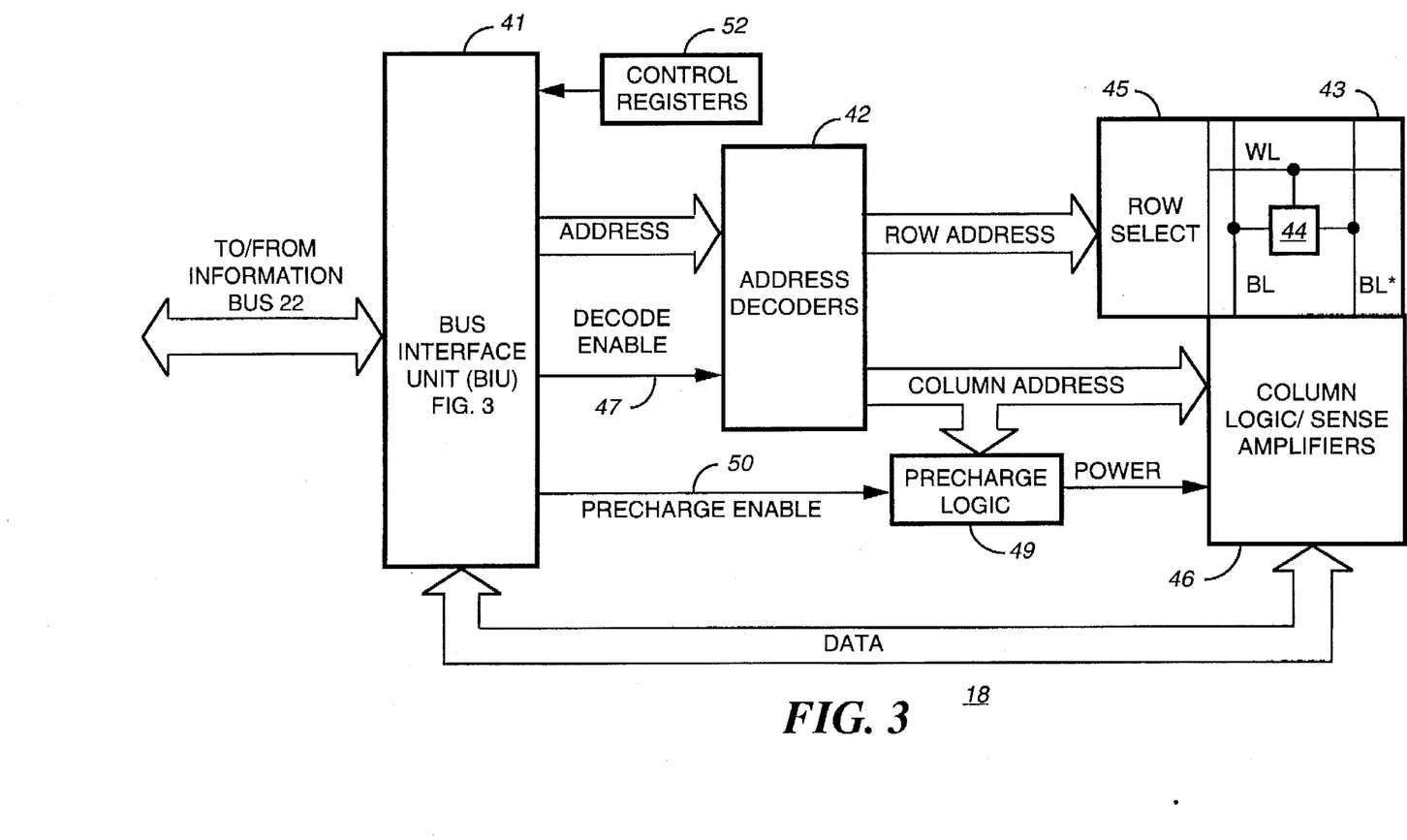
FIG. 3 is a block diagram of a memory included in the data processing system of FIG. 2 in accordance with the present invention.

FIG. 3 illustrates, in block diagram form, memory 18 in accordance with the present invention. Memory 18 includes bus interface unit (BIU) 41, address decoders 42, row select circuits 45, column logic/sense amplifiers 46, memory array 43, and precharge logic 49. Control registers 52 are also included in memory 18 for providing control signals to BIU 41.

BIU 41 is coupled to information bus 22 in order to allow memory 18 to communicate with other portions of circuitry in data processing system 10. For example, BIU 41 can receive address and data signals from CPU 24 across information bus 22, and BIU 41 can transfer data signals back to CPU 24 across information bus 22. BIU 41 can also receive timing signals from timer circuitry 26 across information bus 22.

BIU 41 transfers address signals from information bus 22 to address decoders 42. BIU 41 is also bi-directionally coupled to column logic/sense amplifiers 46 for transferring data signals to and from column logic/sense amplifiers 46. BIU 41 provides an address decode enable signal 47 for enabling or disabling address decoders 42 and further provides a precharge enable signal 50 for enabling or disabling precharge logic 49.

Memory array 43 is a conventional memory array and includes an array of memory cells arranged in rows and columns. Each memory cell is coupled to a word line and to a bit line pair. The word lines are connected to row select circuits 45, and the bit line pairs are connected to column/logic sense amplifiers 46. When accessing memory array 43, a predetermined number of address signals are provided to address decoders 42. The predetermined number of address signals includes a row address portion and a column address portion. The row address portion is provided to the row select circuit 45, and the column address portion is provided to column logic/sense amplifiers 46. The row address is used to select a particular word line, and the column address is used to select a particular bit line pair.

Included in memory 18, but not shown, are bit line loads, write drivers, and equalization circuitry. A memory cell located at the intersection of a selected word line and bit line pair can be accessed for either a read cycle or a write cycle. A representative memory cell 44 is shown connected to a word line labeled "WL" and to a bit line pair labeled "BL" and "BL*". Note that an asterisk (*) after a signal or line name indicates that the signal or line is a logical complement of a signal or line having the same name but lacking the asterisk (*).

During a read cycle of memory 18, a valid address selects a memory cell, e.g., memory cell 44, to be accessed. Information is provided by memory cell 44 to bit line pair BL/BL* in the form of a differential voltage across the bit line pair. Sense amplifiers in column logic/sense amplifiers 46 sense and amplify the differential voltage and provide the differential voltage to BIU 41.

During a write cycle of memory 18, the operation is essentially reversed. Data is provided to column logic/sense amplifiers 46 by BIU 41. A selected bit line pair, for instance bit line pair BL/BL*, receives the data in the form of a differential voltage and provides the differential voltage to a memory cell that is coupled to the selected word line and bit line pair.

Memory 18 has two modes of operation, i.e., high performance mode and low power mode, which are preferably programmed by a user. During the high performance mode, address decode enable signal 47 is asserted to enable address decoders 42 on each transaction from information bus 22. At the same time, precharge enable signal 50 is asserted to enable precharge logic 49 during the time that address decoders 42 are decoding an address from information received over information bus 22. Responsive to precharge enable signal 50, precharge logic 49 precharges columns of memory array 43 by applying power thereto. In this manner, a data transaction, i.e., a read or a write, can occur as soon as the address has been decoded and within one cycle of the clock signal provided by timer circuitry 26 (FIG. 2). This is advantageous in situations in which the clock cycle is relatively fast, such as when the receiver 6 (FIG. 1) of a portable messaging unit is awake for message reception.

During the low power mode, an access of memory 18 requires a greater amount of time, although the access preferably still occurs within one clock cycle. Address decode enable signal 47 is asserted to enable address decoders 42 on each transaction from information bus 22. However, precharge enable signal 50 is not enabled until an address has been decoded by address decoders 42. Responsive to precharge enable signal 50 and to a column address received from address decoders 42, precharge logic 49 precharges only columns of memory array 43 that are associated with the received column address. Therefore, less power is used than in high performance mode. This is very important for electronic devices that are battery powered, such as portable messaging units, since battery life can be quickly depleted without implementation of battery saving methods. In such a messaging unit, the receiver 6 is typically disabled in a conventional manner during time periods in which messages are not expected to be received. During the battery saving times, the clock cycle is generally slowed to draw less current from the battery 13 (FIG. 1). As a result, a selective precharge after an address decode can still provide access to memory array 43 within a single cycle of the clock signal while advantageously minimizing depletion of the battery 13.

It will be appreciated that, when memory 18 comprises a random access memory, selection circuitry (not shown) is also included for selecting only segments of a word line during low power mode. Specifically, during low power mode, only the word line segment associated with the precharged columns is selected by address decoders 42. Conversely, during high performance mode, the entire word line is selected by address decoders 42. This could be accomplished, for instance, by coupling precharge enable signal 50 to both address decoders 42 and precharge logic 49. According to this example, low power mode would be entered when decode enable signal 47 and precharge enable signal 50 are received by address decoders 42 at the same time, in which case the decoded column address would be referenced to select a segment of a word line. When decode enable signal 47 is received in the absence of precharge enable signal 50, high power mode would be entered so that the entire word line is selected.

Figure 4:
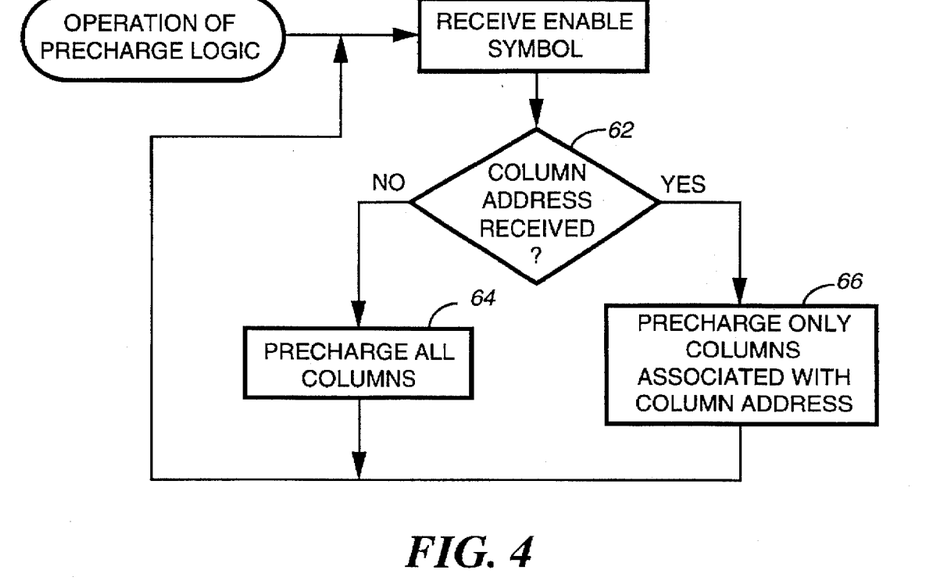
FIG. 4 is a flowchart of an operation of precharge logic included in the memory of FIG. 3 in accordance with the present invention.

FIG. 4 is a flowchart of an operation of precharge logic 49 in accordance with the present invention. At step 60, precharge logic 49 receives precharge enable signal 50 then determines, at step 62, whether it has received a column address from address decoders 42. Absence of a column address from address decoders 42 at the time of reception of precharge enable signal 50 indicates to precharge logic 49 that precharging should occur in high performance mode. In other words, a global precharge should occur. Therefore, all columns of memory array 43 are precharged, at step 64, by precharge logic 49.

Reception of a column address from address decoders 42 when precharge enable signal 50 is received indicates that precharging should occur in low power mode, in which columns of memory array 43 are selectively precharged in accordance with the column address. Therefore, the columns of memory array 43 that are associated with the column address are precharged, at step 66.

According to the present invention, regions of memory array 43 are selectively precharged in low power mode based on word size. When, for instance a word comprises sixteen bits, a column address will indicate to precharge logic 49 which sixteen columns should be precharged. By way of example, a memory array 43 having one-hundred-twenty-eight (128) columns includes eight different regions that can be selectively precharged, given sixteen bit words. Therefore, selective precharging in low power mode requires only an eighth of the power required for global precharging during high performance mode. It will be appreciated that a variety of circuits and/or software, which are not shown, could be included in precharge logic 49 for implementing high performance mode and low power mode in accordance with the present invention.

Figure 5:
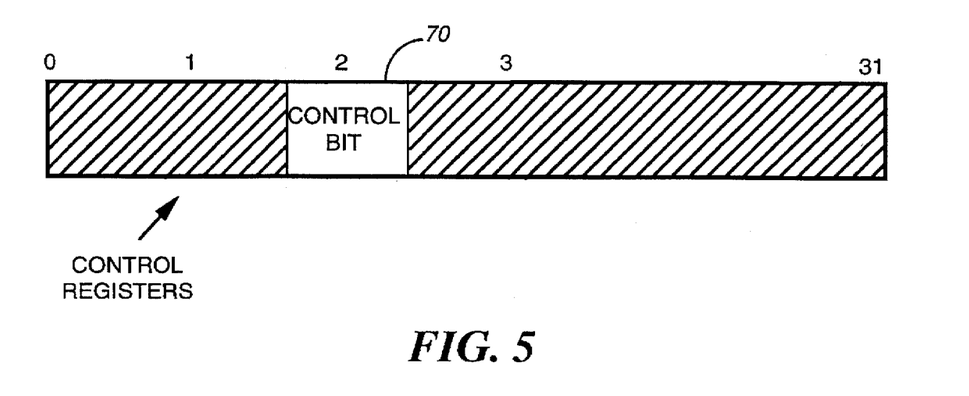
FIG. 5 is a diagram illustrating control registers included in the memory of FIG. 3 in accordance with the present invention.

FIG. 5 illustrates control registers 52 including thirty-two control bits. In other embodiments, control registers 52 can include a greater or lesser number of control bits. Control bit 70 is programmable by the user to provide a predetermined control value. The control bit 70 can, for instance, be programmed through the entry of user-initiated programming signals provided by controls 16 (FIG. 1). Control bit 70 controls whether memory array 43 is accessed in high performance mode or in low power mode. When control bit 70 is asserted, memory 18 operates in low power mode, and when control bit 70 is negated, memory 18 operates in high performance mode.

Figure 6:
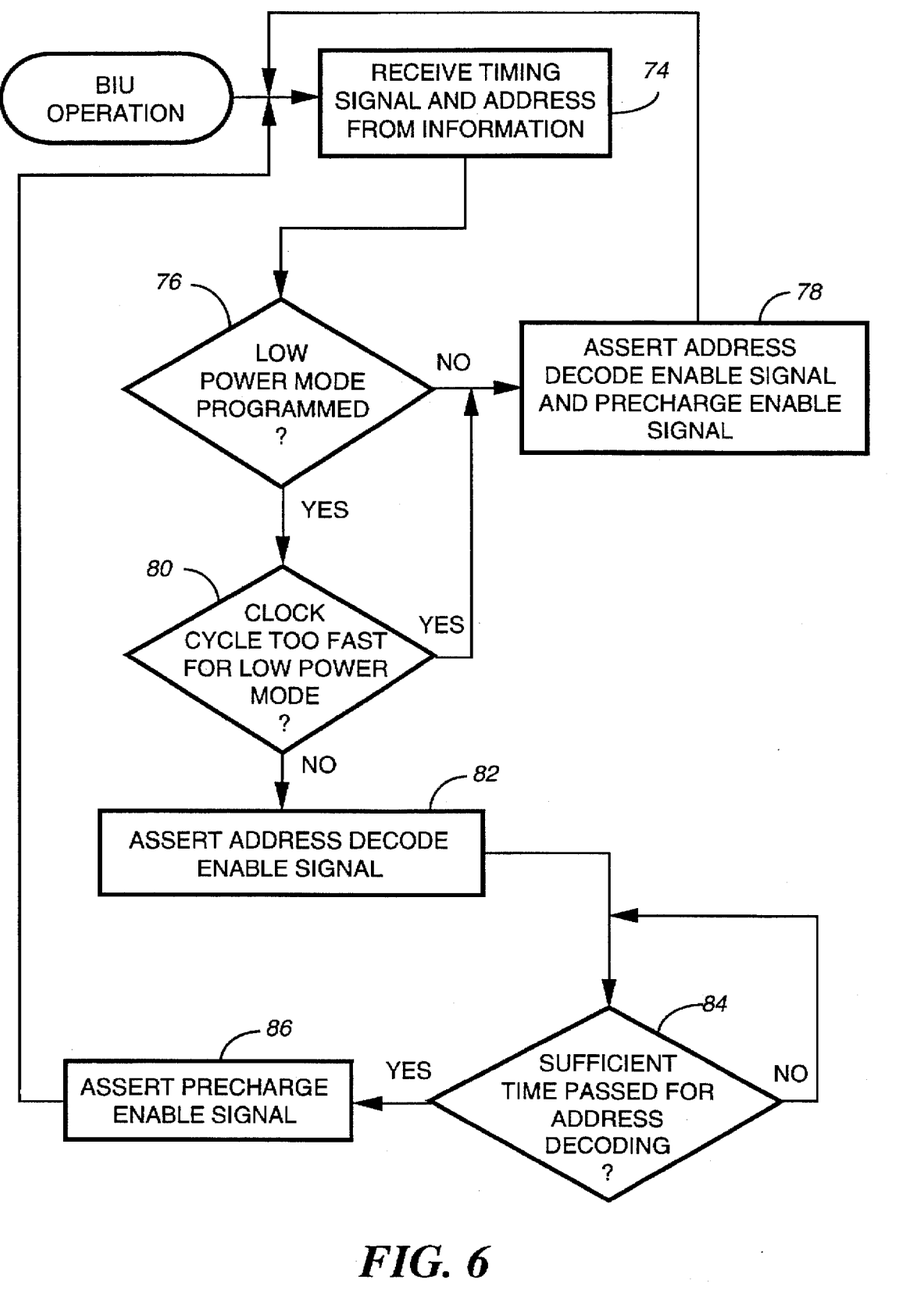
FIG. 6 is a flowchart illustrating an operation of a bus interface unit included in the memory of FIG. 3 in accordance with the present invention.

Referring next to FIG. 6, a flowchart illustrates an operation of BIU 41 (FIG. 3) in accordance with the present embodiment. When, at step 74, BIU 41 receives a timing signal and an address from information bus 22, BIU 41 determines, at step 76, whether control bit 70 is asserted or negated. When control bit 70 is negated, i.e., when the user has not programmed a low power mode, address decode enable signal 47 (FIG. 3) and precharge enable signal 50 are both asserted at substantially the same time, at step 78. In other words, memory array 43 is globally precharged since memory 18 is operating in high performance mode.

When control bit 70 is asserted, i.e., when the user has programmed a preference for low power mode, BIU 41 determines, at step 80, whether the current clock cycle permits implementation of low power mode. Specifically, BIU 41 conventionally determines the clock frequency, time to decode an address, and time to selectively precharge, then determines whether the current clock frequency is such that a data transaction, i.e., a read or a write, could still be performed within a single clock cycle in low power mode.

When, at step 80, the clock speed does not permit implementation of low power mode, address decode enable signal 47 and precharge enable signal 50 are asserted, at step 78, at the same time. Conversely, when, at step 80, low power mode is appropriate, address decode enable signal 47 is asserted, at step 82. After sufficient time has passed for address decoding, at step 84, precharge enable signal 50 is asserted, at step 86, to selectively precharge a region of memory array 43.

Figure 7:
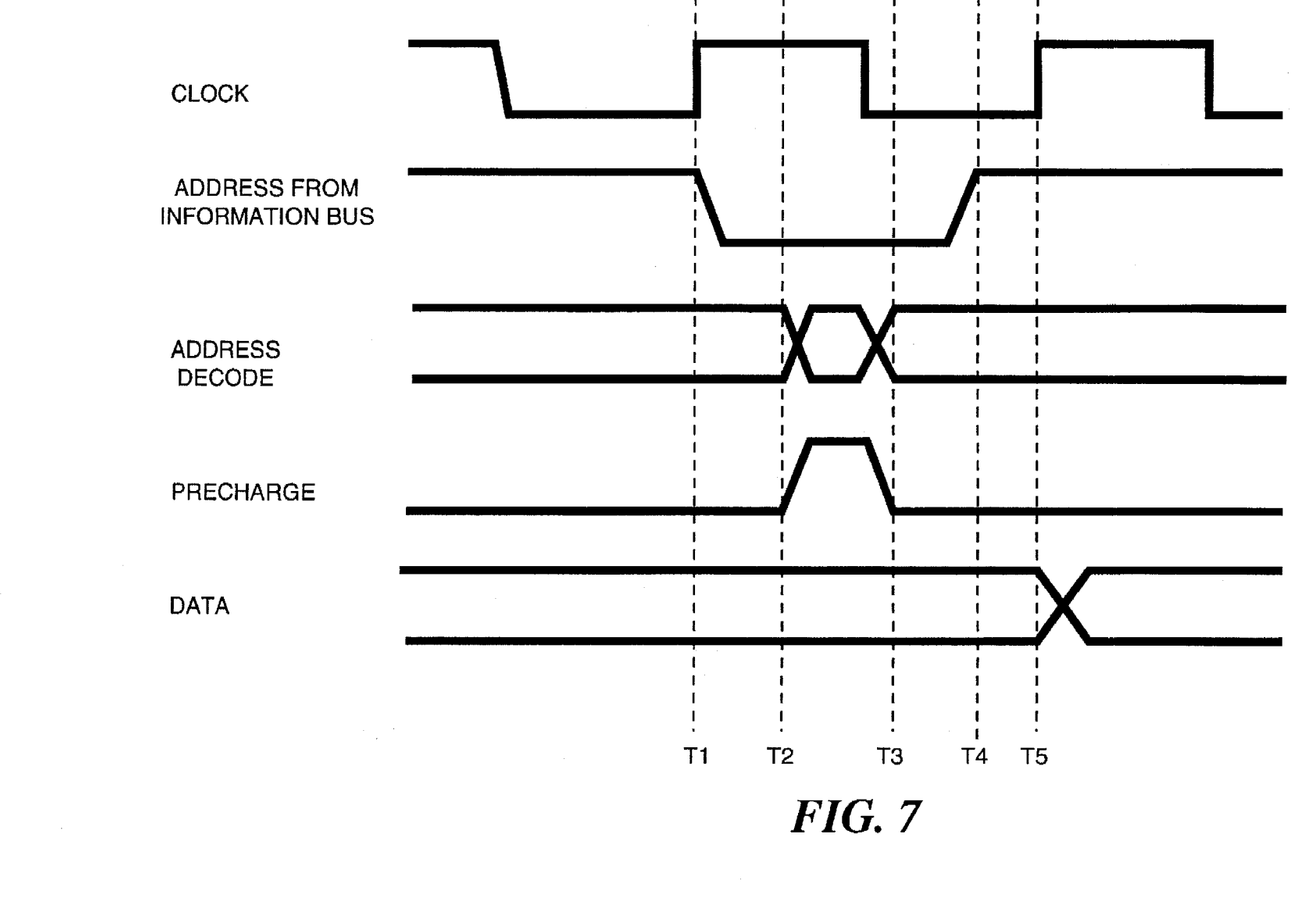
FIG. 7 is a timing diagram of various signals of the memory of FIG. 3 during high performance mode in accordance with the present invention.
Figure 8:
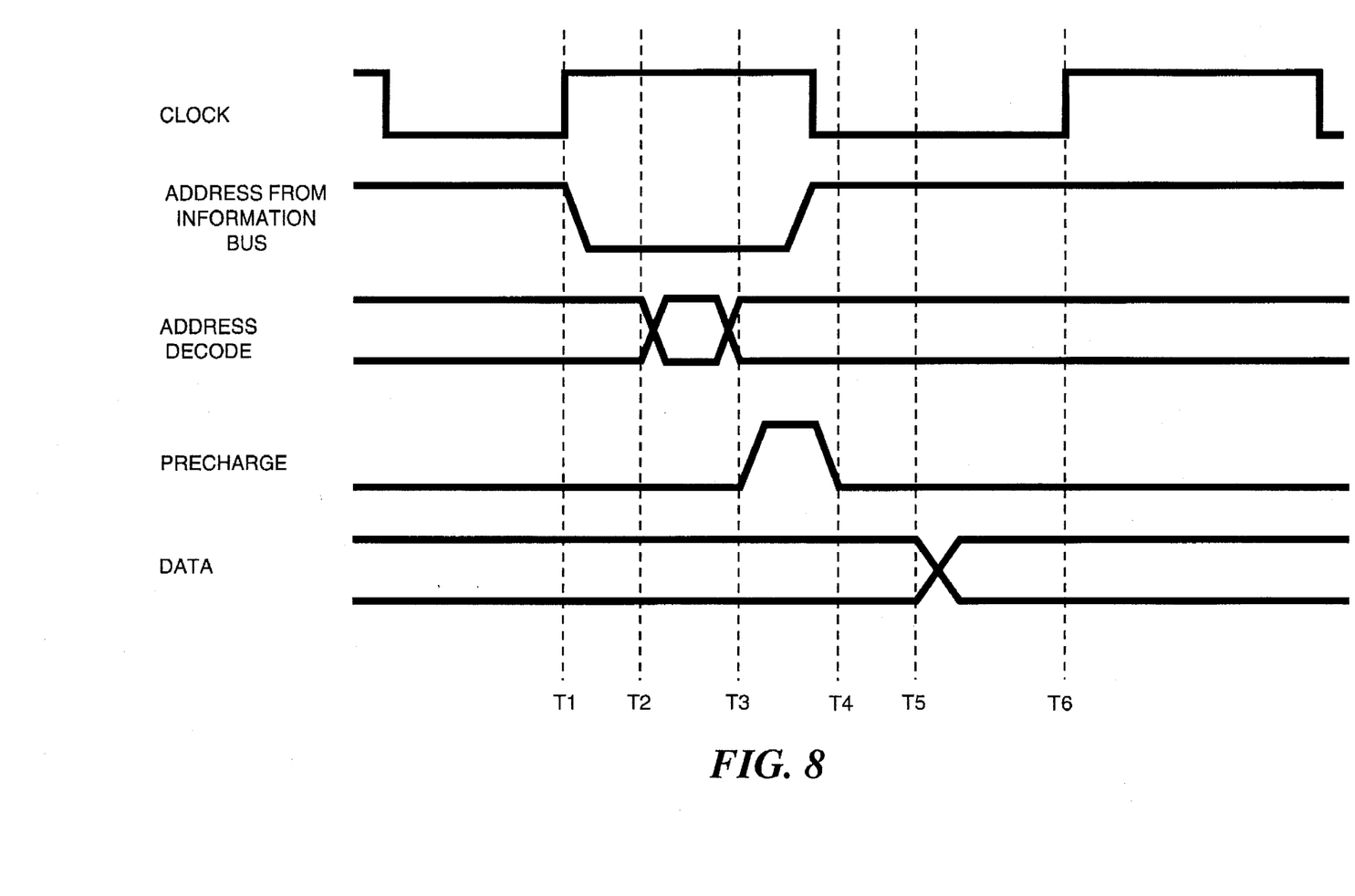
FIG. 8 is a timing diagram of various signals of the memory of FIG. 3 during low power mode in accordance with the present invention.

FIGS. 7 and 8 are timing diagrams of various signals of memory 18 (FIG. 3). The various signals of FIGS. 7 and 8 are not drawn to scale. FIG. 7 illustrates memory signals during high performance mode. At T1, address information is received from information bus 22. Responsive to the address information, address decode enable signal 47 is asserted, and address decoding begins at T2. At the same time, precharge enable signal 50 is asserted so that global precharging also begins at T2. Only after precharging and decoding have ended, at T3, does a data transaction occur at T4. The data transaction occurs prior to the beginning of the next cycle of the clock signal at T5. It will be appreciated by one of ordinary skill in the art that address decoding and global precharging are shown as requiring the same amount of time for example purposes only. In some embodiments of the present invention, address decoding and global precharging can require differing amounts of time. However, regardless of required times for decoding and precharging, the decoding and precharging preferably begin at the same time during high performance mode, and the data transaction does not occur until both decoding and precharging are complete.

FIG. 8 illustrates memory signals during low power mode. At T1, address information is received from information bus 22. The beginning of the bus transaction is the same as for high performance mode (FIG. 7). In response to receiving the address information, address decode enable signal 47 is asserted at T2. However, precharge enable signal 50 is not asserted until after address decoding has been completed at T3. Next, after selected columns of memory array 43 have been precharged at T4, the data transaction can occur at T5. The next clock cycle begins at T6.

As mentioned above, even when low power mode is programmed, the selective precharge only occurs when there is enough time for a read or write before the next clock cycle. Therefore, when device operations require a relatively fast clock, such as when receiver 6 (FIG. 1) is enabled for message reception, it is likely that a high performance global precharge will be necessary even though low power mode is programmed. During times when the clock frequency is lower, however, the selective precharge provides for power savings while still enabling memory access within a single clock cycle.

In summary, an electronic device as described above includes a data processing system in which a memory can be accessed in low power mode or high performance mode. The mode is preferably programmed by a user through device controls. When the device is programmed only for high performance mode, a memory address is decoded in parallel with a global precharge of all memory columns. Once the address is decoded and the memory is precharged, the memory can be accessed for a read or write operation. Although data transactions occur very rapidly in high performance mode, the global precharge of all memory columns requires a relatively large amount of power.

When the device is programmed for low power mode, the memory address is decoded prior to precharging columns of the memory. Once the address is decoded, only columns associated with the address are precharged, after which a data transaction can occur. Because only selected regions of the memory are precharged in low power mode, drain on the battery is advantageously minimized. Therefore, a battery powered device utilizing the memory according to the present invention can realize a significant increase in battery life.

It will be appreciated by now that there has been provided an improved low power mode for use with a memory included in an electronic device.

What is claimed is:

1. A data processing system for providing memory access, comprising:
   a memory, including:
   a memory array having memory cells arranged in rows and columns;
   an address decoder for accessing a memory cell of the memory array in response to decoding an address signal; and
   precharge logic coupled to the memory array and the address decoder for enabling, in a high performance mode, all columns of the memory array prior to accessing the memory cell and for enabling, in a low power mode, only selected columns of the memory array prior to accessing the memory cell.

2. The data processing system of claim 1, further comprising:
   an interface unit coupled to the address decoder and the precharge logic for placing the precharge logic in the low power mode, in which the precharge logic enables only the selected columns of the memory array subsequent to the address decoder decoding the address signal, or the high performance mode, in which the precharge logic enables all columns of the memory array while the address decoder decodes the address signal.

3. The data processing system of claim 2, wherein the selected columns of the memory array are associated with an address decoded by the address decoder.

4. The data processing system of claim 2, further comprising:
   control registers coupled to the interface unit for receiving a programming signal in response to which a control bit is programmed to indicate whether the memory is to operate in the high performance mode or the low power mode.

5. The data processing system of claim 2, wherein, in both the high performance mode and the low power mode, the memory cell is accessed within one cycle of a clock signal.

6. The data processing system of claim 5, further comprising:
   timer circuitry for generating the clock signal; and
   an information bus for coupling the timer circuitry and the memory.

7. An electronic device for providing memory access, the electronic device comprising:
   a receiver for receiving messages; and
   a memory coupled to the receiver for storing the messages, the memory including:
   a memory array having memory cells arranged in rows and columns;
   an address decoder for accessing a memory cell of the memory array in response to decoding an address signal; and
   precharge logic coupled to the memory array and the address decoder for enabling, in a high performance mode, all columns of the memory array prior to accessing the memory cell and for enabling, in a low power mode, only selected columns of the memory array prior to accessing the memory cell.

8. The electronic device of claim 7, further comprising:
   a battery coupled to the receiver and the memory for powering the electronic device.

9. The electronic device of claim 7, further comprising:
   an interface unit coupled to the address decoder and the precharge logic for placing the precharge logic in the low power mode, in which the precharge logic enables only the selected columns of the memory array subsequent to the address decoder decoding the address signal, or the high performance mode, in which the precharge logic enables all columns of the memory array while the address decoder decodes the address signal.

10. The electronic device of claim 9, wherein the selected columns of the memory array are associated with an address decoded by the address decoder.

11. The electronic device of claim 9, further comprising:
    control registers coupled to the interface unit for receiving a programming signal in response to which a control bit is programmed to indicate whether the memory is to operate in the high performance mode or the low power mode.

12. The electronic device of claim 9, wherein, in both the high performance mode and the low power mode, the memory cell is accessed within one cycle of a clock signal.

13. The electronic device of claim 12, further comprising:
    timer circuitry for generating the clock signal; and
    an information bus for coupling the timer circuitry and the memory.

14. The electronic device of claim 13, wherein the memory is included in a microcontroller.

15. A method, in an electronic device, for providing memory access in a high performance mode and a low power mode, the electronic device comprising a memory including a memory array and an address decoder for accessing a memory cell of the memory array, the method comprising the steps of:
    decoding an address signal to recover a memory address indicative of the memory cell;
    enabling, when the memory is in the low power mode, only selected columns of the memory array associated with the memory address;
    enabling, when the memory is in the high performance mode, all columns of the memory array; and
    accessing the memory cell subsequent to either the enabling step in the low power mode or the enabling step in the high performance mode.

16. The method of claim 15, wherein:
    the enabling step in the low power mode comprises the step of enabling the selected columns subsequent to decoding the address signal; and
    the enabling step in the high performance mode comprises the step of enabling all columns while decoding the address signal.

17. The method of claim 16, further comprising the step of:
    programming the memory into the high performance mode or the low power mode.

18. The method of claim 16, further comprising the step of:
    receiving a clock signal, wherein the memory cell is accessed within a single cycle of the clock signal.

19. The method of claim 18, further comprising the steps of:
    determining that the memory is in the low power mode;
    determining, prior to the enabling step, that the clock signal is too fast for the low power mode; and
    operating in the high performance mode in response to determining that the clock signal is too fast.

* * * * *